US010886821B2

United States Patent
Larson et al.

(10) Patent No.: US 10,886,821 B2
(45) Date of Patent: Jan. 5, 2021

(54) HAPTIC ACTUATOR INCLUDING THERMALLY COUPLED HEAT SPREADING LAYER AND RELATED METHODS

(71) Applicant: Apple Inc., Cupertino, CA (US)

(72) Inventors: Nils E. Larson, San Jose, CA (US); Jere C. Harrison, San Jose, CA (US); Vu A. Hong, Palo Alto, CA (US)

(73) Assignee: APPLE INC., Cupertino, CA (US)

( * ) Notice: Subject to any disclaimer, the term of this patent is extended or adjusted under 35 U.S.C. 154(b) by 6 days.

(21) Appl. No.: 16/235,091

(22) Filed: Dec. 28, 2018

(65) Prior Publication Data

US 2020/0212766 A1 Jul. 2, 2020

(51) Int. Cl.
*H02K 9/22* (2006.01)
*H02K 33/18* (2006.01)
(Continued)

(52) U.S. Cl.
CPC .............. *H02K 9/22* (2013.01); *F28F 21/02* (2013.01); *F28F 21/085* (2013.01); *G08B 6/00* (2013.01); *H02K 33/18* (2013.01); *H05K 7/20445* (2013.01); *H05K 7/20509* (2013.01); *H02K 33/00* (2013.01); *H02K 2209/00* (2013.01)

(58) Field of Classification Search
CPC ... F28F 2013/006; H02K 33/00; H02K 33/02; H02K 33/18; H02K 2209/00; H02K 11/0094; B06B 1/04; B06B 1/045; H05K 7/20; H05K 9/00; H05K 7/2039;
(Continued)

(56) References Cited

U.S. PATENT DOCUMENTS 6,965,071 B2 * 11/2005 Watchko ................... C23C 4/00
174/377
7,486,517 B2 * 2/2009 Aapro ................... H04M 1/026
165/104.33
(Continued)

FOREIGN PATENT DOCUMENTS

WO 2013169299 A1 11/2013
WO 2013169303 A1 11/2013
(Continued)

OTHER PUBLICATIONS

Product Specification Sheet: GEEPLUS, VIBRO1 Vibration Actuator, 2 pages, www.geeplus.biz, downloaded on Jul. 15, 2015.
(Continued)

*Primary Examiner* — Burton S Mullins
(74) *Attorney, Agent, or Firm* — Allen, Dyer, Doppelt + Gilchrist, P.A.

(57) ABSTRACT

A haptic actuator may include a housing that includes a ferromagnetic material having a first heat conductance, and a coil carried by the housing in a medial portion thereof and generating waste heat when electrically powered. The haptic actuator may also include a field member movable within the housing responsive to the coil. The field member may include at least one permanent magnet establishing a magnetic path with the housing. A heat spreading layer may be thermally coupled to the housing adjacent the coil. The heat spreading layer may have a second heat conductance greater than the first heat conductance to spread the waste heat from the coil to adjacent portions of the housing.

26 Claims, 13 Drawing Sheets

(51) Int. Cl.
*H05K 7/20* (2006.01)
*F28F 21/02* (2006.01)
*G08B 6/00* (2006.01)
*F28F 21/08* (2006.01)
*H02K 33/00* (2006.01)

(58) Field of Classification Search
CPC ...... H05K 7/20509; H05K 5/04; G06F 1/203;
B32B 15/011
USPC ................ 310/15, 17, 64; 361/704, 679.54;
165/185
See application file for complete search history.

(56) References Cited

U.S. PATENT DOCUMENTS

| | | | | |
|---|---|---|---|---|
| 7,732,951 B2* | 6/2010 | Mukaide | ............... | H02K 41/03 |
| | | | | 310/12.21 |
| 7,800,257 B2* | 9/2010 | Lu | ................. | H02K 41/02 |
| | | | | 310/12.29 |
| 8,169,286 B2* | 5/2012 | Hasegawa | ........... | H01F 27/2871 |
| | | | | 336/200 |
| 8,169,402 B2 | 5/2012 | Shahoian et al. | | |
| 8,477,499 B2* | 7/2013 | Hill | .................. | H05K 7/2039 |
| | | | | 361/707 |
| 8,842,086 B2* | 9/2014 | Ogg | ................. | G06F 3/016 |
| | | | | 345/156 |
| 8,982,317 B2* | 3/2015 | Wiener | ............... | G03F 7/70758 |
| | | | | 355/30 |
| 9,128,685 B2* | 9/2015 | Choi | ................ | G06F 1/203 |
| 9,210,991 B2* | 12/2015 | Nishi | ............... | A45C 5/02 |
| 9,282,681 B2* | 3/2016 | Rugg | ................ | H05K 7/2039 |
| 9,389,029 B2* | 7/2016 | Chowdhury | ........... | F28F 21/06 |
| 9,467,033 B2* | 10/2016 | Jun | .................... | B06B 1/045 |
| 9,652,005 B2* | 5/2017 | Saeidi | ............... | G06F 1/206 |
| 9,735,826 B2* | 8/2017 | Sohn | ................ | H04B 1/3888 |
| 9,805,861 B2* | 10/2017 | Kato | ................ | H01Q 1/248 |
| 10,095,283 B2* | 10/2018 | Hur | .................. | H05K 7/2039 |
| 10,141,625 B1* | 11/2018 | Ryu | ................. | H01Q 1/02 |
| 10,667,432 B2* | 5/2020 | Sutherland | ............. | G06F 1/203 |
| 10,699,985 B2* | 6/2020 | Chung | ................ | H05K 7/20 |
| 10,787,014 B2* | 9/2020 | Hooton | ................ | H05K 5/0217 |
| 2007/0115644 A1* | 5/2007 | Kim | ................ | H05K 5/0086 |
| | | | | 361/720 |
| 2014/0197936 A1 | 7/2014 | Biggs et al. | | |
| 2014/0217864 A1* | 8/2014 | Browning | ................ | H05K 5/04 |
| | | | | 312/223.1 |
| 2014/0369000 A1* | 12/2014 | Kim | ................ | H01L 23/473 |
| | | | | 361/689 |
| 2015/0062823 A1* | 3/2015 | Seo | .................. | B32B 38/18 |
| | | | | 361/704 |
| 2015/0109223 A1 | 4/2015 | Kessler et al. | | |
| 2015/0116205 A1 | 4/2015 | Westerman et al. | | |
| 2015/0124401 A1* | 5/2015 | Prest | .................. | C22C 45/10 |
| | | | | 361/679.55 |
| 2015/0130730 A1 | 5/2015 | Harley et al. | | |
| 2015/0349619 A1* | 12/2015 | Degner | ............. | H02K 41/0356 |
| | | | | 310/12.21 |
| 2016/0020810 A1* | 1/2016 | Platt | ................. | H04B 1/3888 |
| | | | | 455/556.1 |
| 2016/0150679 A1* | 5/2016 | Cheng | ................ | G06F 1/20 |
| | | | | 361/709 |
| 2017/0078572 A1* | 3/2017 | Miller | ............... | H04N 5/23241 |
| 2017/0085163 A1* | 3/2017 | Hajati | ................ | H02K 33/00 |
| 2017/0090574 A1* | 3/2017 | Baer | .................. | G06F 3/016 |
| 2017/0315598 A1* | 11/2017 | Voth | ................. | G06F 1/203 |
| 2018/0007181 A1* | 1/2018 | Lee | .................. | H05K 5/04 |
| 2019/0195577 A1* | 6/2019 | Kim | ................. | H05K 9/0024 |

FOREIGN PATENT DOCUMENTS

| | | |
|---|---|---|
| WO | 2013169305 A1 | 11/2013 |
| WO | 2013170099 A1 | 11/2013 |
| WO | 2013188307 A2 | 12/2013 |
| WO | 2014018111 A1 | 1/2014 |
| WO | 2015020663 A1 | 2/2015 |

OTHER PUBLICATIONS

Cheneler et al.; Active Thermal Sensor for Improved Distributed Temperature Sensing in Haptic Arrays; Journal of Sensors; https://doi.org/10.1155/2018/9631236; vol. 2018; Article ID 9631236, 15 pages.

* cited by examiner

HAPTIC ACTUATOR INCLUDING THERMALLY COUPLED HEAT SPREADING LAYER AND RELATED METHODS

TECHNICAL FIELD

The present disclosure relates to the field of electronics, and, more particularly, to the field of haptics.

BACKGROUND

Haptic technology is becoming a more popular way of conveying information to a user. Haptic technology, which may simply be referred to as haptics, is a tactile feedback based technology that stimulates a user's sense of touch by imparting relative amounts of force to the user.

A haptic device or haptic actuator is an example of a device that provides the tactile feedback to the user. In particular, the haptic device or actuator may apply relative amounts of force to a user through actuation of a mass that is part of the haptic device. Through various forms of tactile feedback, for example, generated relatively long and short bursts of force or vibrations, information may be conveyed to the user.

SUMMARY

A haptic actuator may include a housing that includes a ferromagnetic material having a first heat conductance. The haptic actuator may also include at least one coil carried by the housing in a medial portion thereof and generating waste heat when electrically powered. The haptic actuator may also include a field member movable within the housing responsive to the at least one coil. The field member may include at least one permanent magnet establishing a magnetic path with the housing. A heat spreading layer may be thermally coupled to the housing adjacent the at least one coil. The heat spreading layer may have a second heat conductance greater than the first heat conductance to spread the waste heat from the at least one coil to adjacent portions of the housing.

The heat spreading layer may be between the at least one coil and adjacent housing portions, for example. The heat spreading layer may include a non-ferromagnetic material, for example.

The heat spreading layer may extend laterally outwardly from the medial portion of the housing. The heat spreading layer may include at least one projection extending through the housing.

The at least one coil may include a single upper coil and a single lower coil, for example. At least one of the single upper coil and single lower coil may have an opening in a central portion thereof, and may include a temperature sensor within the opening in the central portion.

The haptic actuator may also include at least one flexure movably mounting the field member within the housing. The housing may include steel, for example. The heat spreading layer may include at least one of copper and graphite, for example.

A method aspect is directed to a method of making a haptic actuator. The method may include mounting at least one coil within a housing in a medial portion thereof with the at least one coil generating waste heat when electrically powered. The housing may include a ferromagnetic material having a first heat conductance. The method may also include mounting a field member to be movable within the housing responsive to the at least one coil. The field member may include at least one permanent magnet establishing a magnetic path with the housing. The method may also include thermally coupling a heat spreading layer to the housing adjacent the at least one coil. The heat spreading layer may have a second heat conductance greater than the first heat conductance to spread the waste heat from the at least one coil to adjacent portions of the housing.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation is used to indicate similar elements in alternative embodiments.

Figure 1:
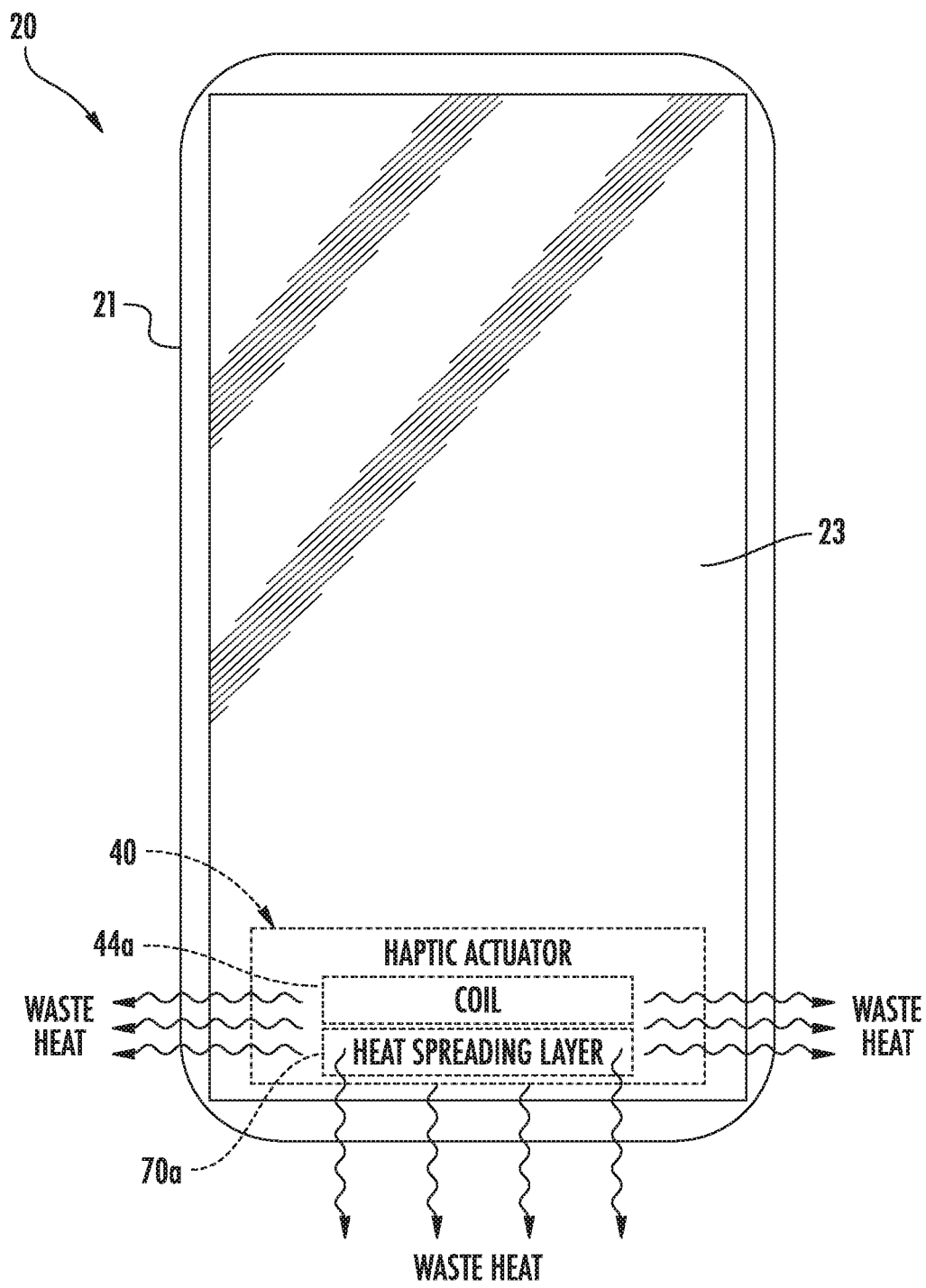
FIG. 1 is a schematic diagram of an electronic device in accordance with an embodiment.
Figure 2:
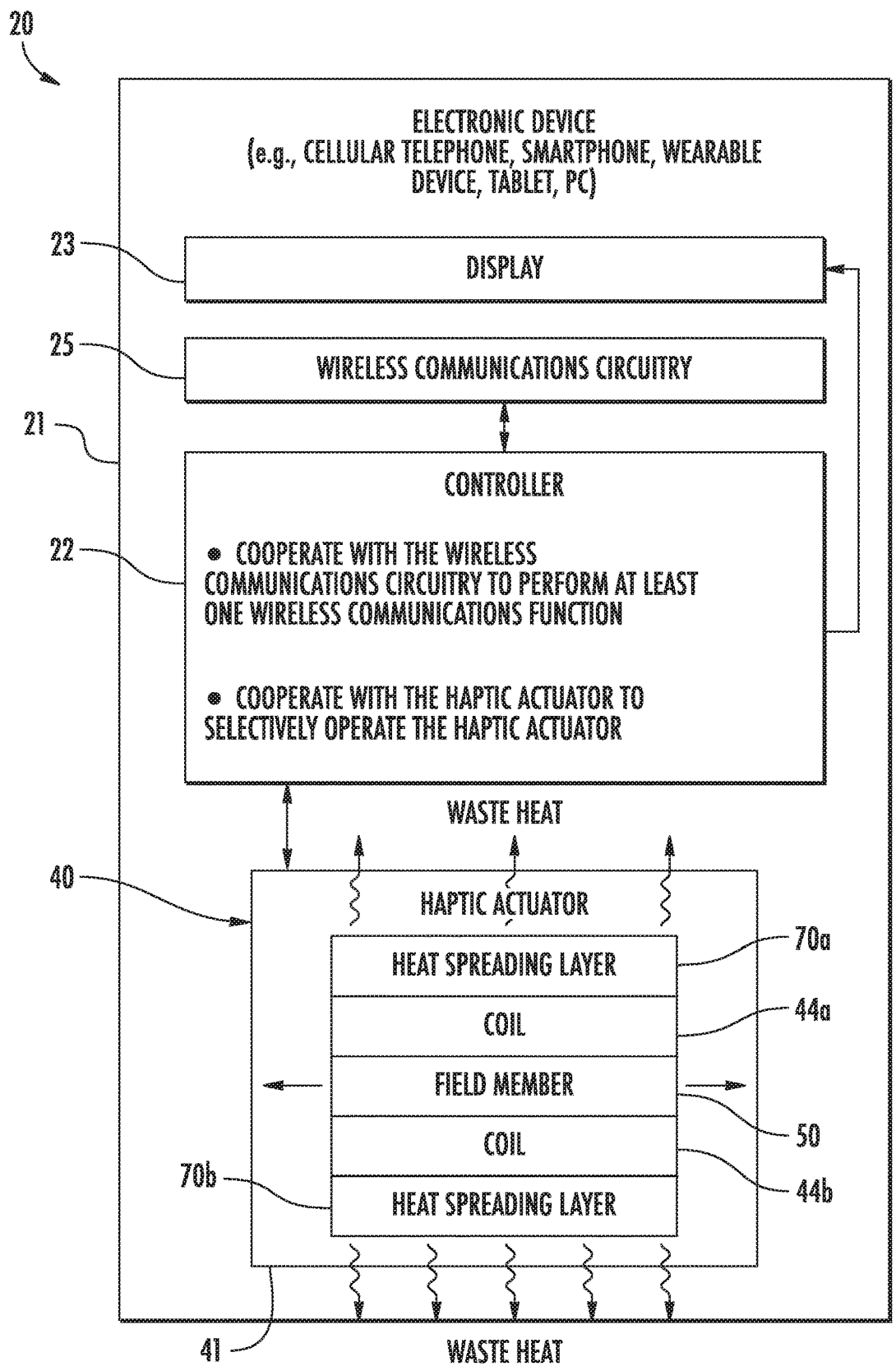
FIG. 2 is another schematic diagram of the electronic device of FIG. 1.
Figure 3:
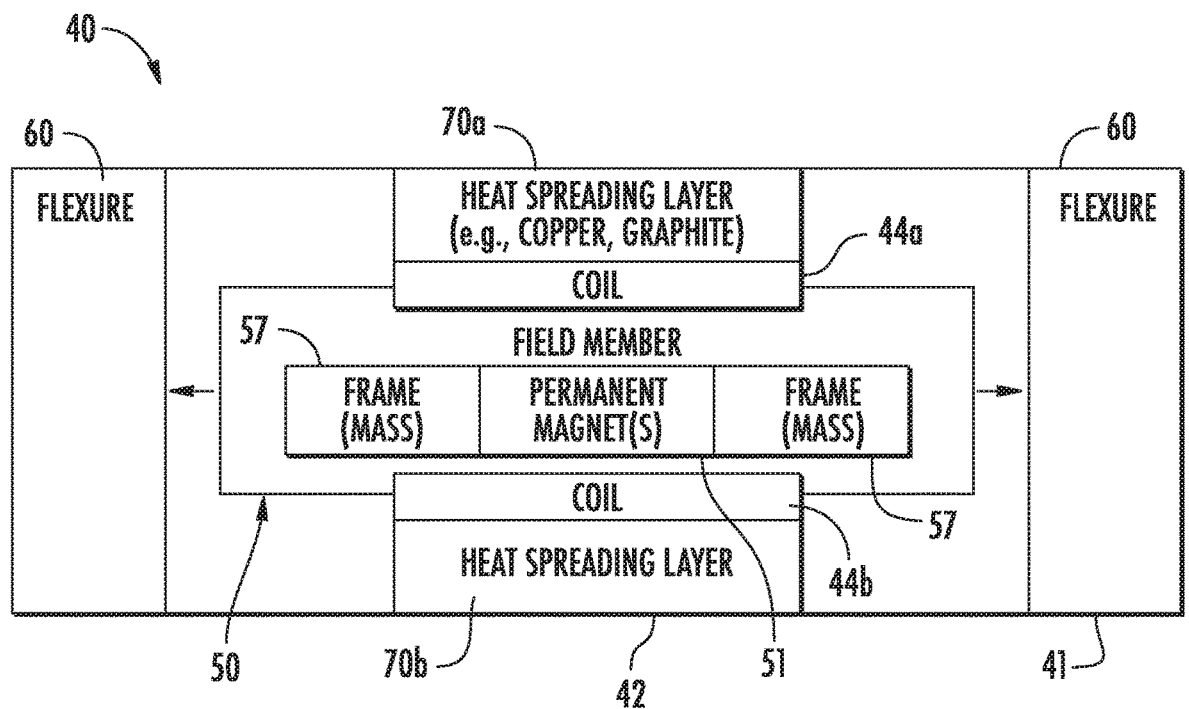
FIG. 3 is a schematic block diagram of a portion of the haptic actuator of FIG. 2.

Referring initially to FIGS. 1-3, an electronic device 20 illustratively includes a device housing 21 and a controller 22 carried by the device housing. The electronic device 20 is illustratively a mobile wireless communications device, for example, a cellular telephone or smartphone. The electronic device 20 may be another type of electronic device, for example, a wearable device (e.g., a watch), a tablet computer, a laptop computer, etc.

Wireless communications circuitry 25 (e.g. cellular, WLAN Bluetooth, etc.) is also carried within the device housing 21 and coupled to the controller 22. The wireless communications circuitry 25 cooperates with the controller 22 to perform at least one wireless communications function, for example, for voice and/or data. In some embodiments, the electronic device 20 may not include wireless communications circuitry 25.

A display 23 is also carried by the device housing 21 and is coupled to the controller 22. The display 23 may be, for example, a light emitting diode (LED) display, a liquid crystal display (LCD), or may be another type of display, as will be appreciated by those skilled in the art. The display 23 may be a touch display and may cooperate with the controller 22 to perform a device function in response to operation thereof. For example, a device function may include a powering on or off of the electronic device 20, initiating communication via the wireless communications circuitry 25, and/or performing a menu function.

The electronic device 20 illustratively includes a haptic actuator 40. The haptic actuator 40 is coupled to the controller 22 and provides haptic feedback to the user in the form of relatively long and short vibrations. The vibrations may be indicative of a message received, and the duration and type of the vibration may be indicative of the type of message received. Of course, the vibrations may be indicative of or convey other types of information.

While a controller 22 is described, it should be understood that the controller 22 may include one or more of a processor and other circuitry to perform the functions described herein. For example, the controller 22 may include a class-D amplifier to drive the haptic actuator 40 and/or sensors for sensing voltage and current.

Figure 4:
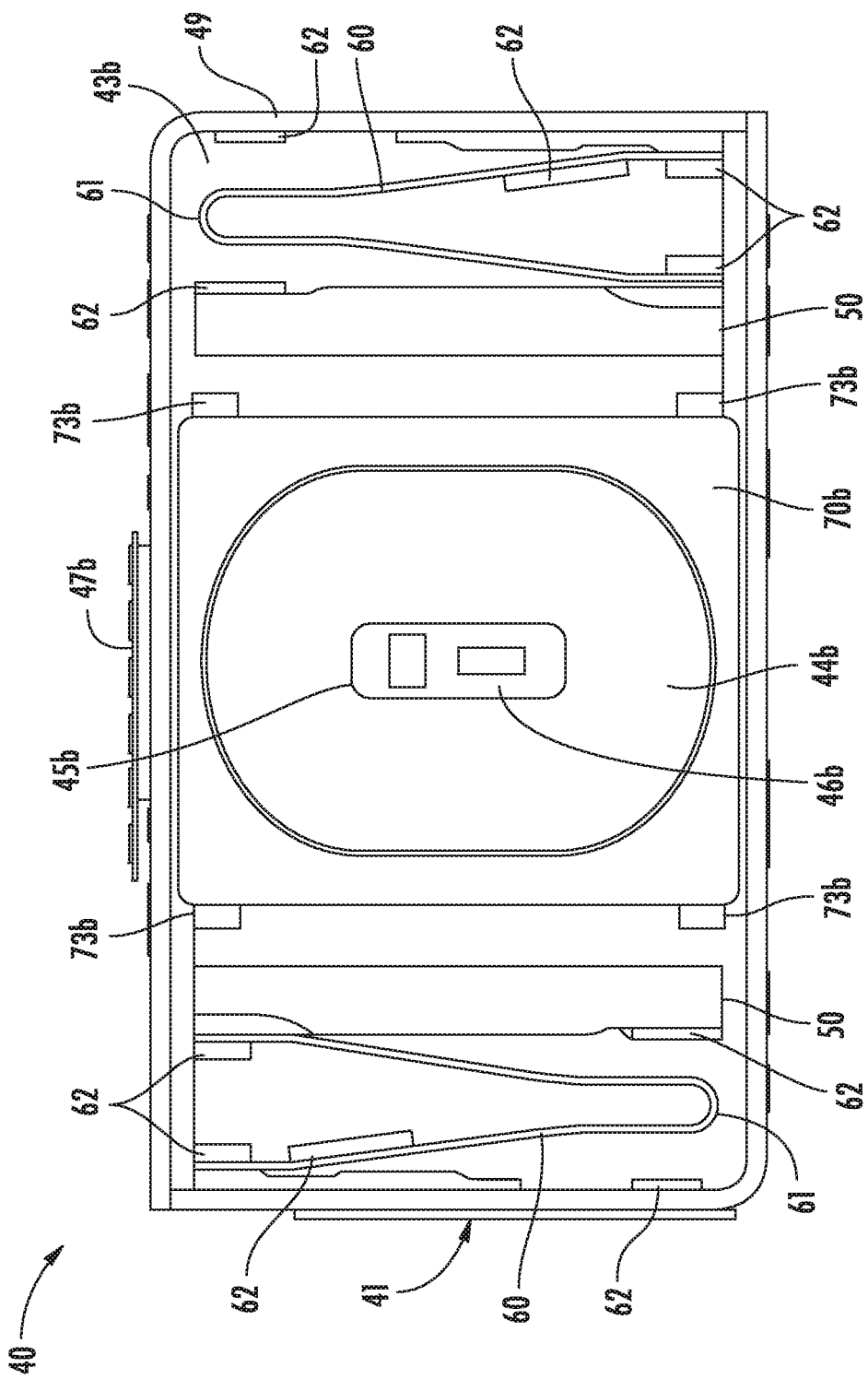
FIG. 4 is a schematic diagram of a portion of a haptic actuator in accordance with an embodiment.
Figure 5:
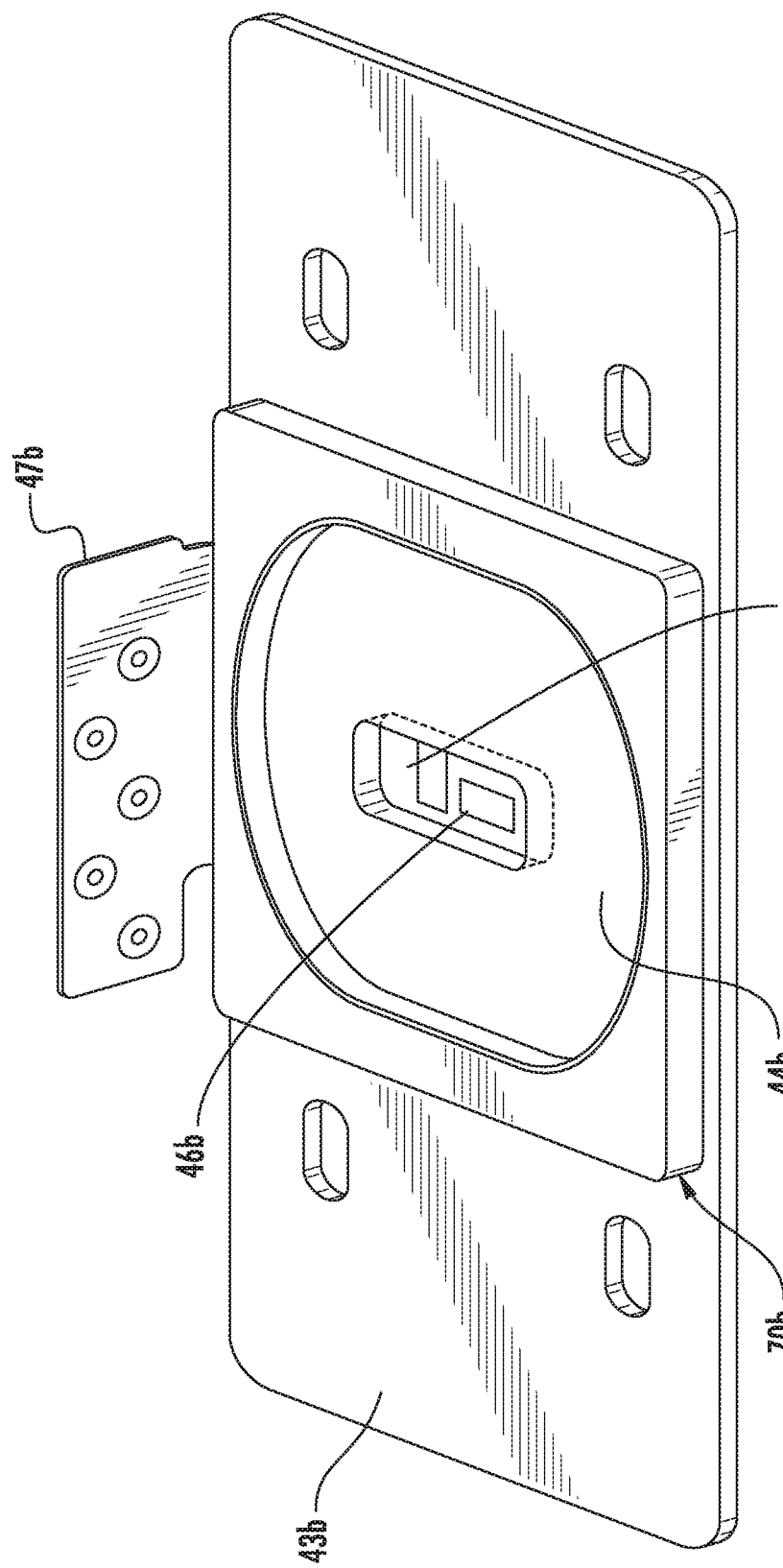
FIG. 5 is a schematic perspective view of a portion of the haptic actuator of FIG. 4.

Referring now additionally to FIGS. 4-5, the haptic actuator 40 includes an actuator housing 41 that may be metal or a ferromagnetic material (e.g., steel) having a first heat conductance (e.g., 16-54 W·m$^{-1}$ K$^{-1}$). The actuator housing 41 may be another type of material or include more than one type of material, for example, polymer and/or ceramic based materials. The actuator housing 41 has a top 43a and an opposing bottom 43b spaced apart from the top by a frame 49. The actuator housing 41 illustratively has a dimension in a length direction greater than a width direction (e.g., x-axis travel direction). The haptic actuator 40 also includes a single upper coil 44a carried by the top 43a of the actuator housing 41 and a single lower coil 44b carried by the bottom 43b of the actuator housing. The coils 44a, 44b are carried in a medial portion 42 of the actuator housing 41 and each generates waste heat when electrically powered, as will be appreciated by those skilled in the art.

For ease of explanation, further details will be explained with reference to the lower single coil 44b. The lower single coil 44b has an opening 45b in a central portion thereof. A temperature sensor 46b is illustratively carried by a circuit substrate 47b (e.g., flexible circuit substrate) within the central portion of each coil 44b. The temperature sensor 46b may be particularly advantageous for measuring the operating temperature of the haptic actuator adjacent the coil 44b. As will be appreciated by those skilled in the art, a relatively high operating temperature (e.g., based upon the waste heat) may degrade operation of the haptic actuator 40, and in some instances may cause actuator failure.

The temperature sensor 46b may cooperate with the controller 22 to, for example, throttle back operation of the haptic actuator 40 by providing less electrical power to the coil 44b at a first temperature threshold while discontinuing operation (i.e., applying no electrical power to the coils) at a second temperature threshold higher than the first temperature threshold. Accordingly, waste heat generated from the coil 44b may be undesirable. The throttling or discontinuing of operation of the haptic actuator 40 based upon the temperature sensor 46b may occur regardless of whether operation of the haptic actuator is desired for providing haptic feedback.

The coil 44b illustratively has a loop shape or "racetrack" shape. While a single lower coil 44b is illustrated, more than one coil may be carried by or adjacent the bottom 43b of the actuator housing 41, for example.

While further details have been described with respect to the single lower coil 44b, the description and elements are similarly applicable to the single upper coil 44a carried adjacent the top 43a of the actuator housing 41. Also, similarly to the single lower coil 44b, there may be more than one upper coil 44a.

The haptic actuator 40 also includes a field member 50 carried by the actuator housing 41. The field member 50 is movable within the actuator housing 41 responsive to the coils 44a, 44b.

The field member 50 includes a frame 57 defining a mass (FIG. 3). The frame may be tungsten, for example. Of course, the frame 57 may be a different material (e.g., relatively heavy material). In some embodiments, there may be discrete masses carried by the frame which may be a same or different material than the frame 57.

The field member 50 includes spaced apart permanent magnets 51 that establish a magnetic path within the actuator housing 41 (FIG. 3). The permanent magnets 51 may be carried within magnet receiving through openings in frame 57. The permanent magnets 51 may be neodymium, for example, and may be positioned in opposing directions with respect to their respective poles. The permanent magnets 51 may also have a rounded rectangle shape and may be aligned along a length of the coil 44a, 44b. There may be any number of permanent magnets 51 having any shape.

The haptic actuator 40 also includes respective flexures 60 movably mounting (e.g., reciprocally movable) the field member 50 within the actuator housing 41 (FIGS. 3-4). Each flexure 60 illustratively has a wishbone or Y-shape, with two diverging arms joined together at proximal ends by a bend 61. Damping elements 62 are carried by distal ends of the two diverging arms, along an inside of the one of the diverging arms, and by the field member 50 and the actuator housing 41 adjacent the bend 61. While an example flexure 60 is illustrated, each flexure may have a different shape and more than one flexure may be used to couple each end of the field member 50 to an adjacent end of the actuator housing 41.

Heat spreading layers 70a, 70b are thermally coupled to the actuator housing 41 (the top 43a and bottom 43b, respectively) adjacent the upper and lower coils 44a, 44b. More particularly, the heat spreading layers 70a, 70b are each between the upper and lower coils 44a, 44b, respectively, and the adjacent portions of the actuator housing 41. Each heat spreading layer 70a, 70b includes a non-ferromagnetic material. Each heat spreading layer 70a, 70b may wholly or partially be physically coupled directly to the actuator housing 41, for example, and/or may wholly or partially be indirectly coupled to the actuator housing (e.g., by way of an adhesive layer, such as, for example, a pressure sensitive adhesive or an epoxy). In some embodiments, the heat spreading layers 70a, 70b may include additional and/or other materials. While two heat spreading layers 70a, 70b are illustrated (FIGS. 2 and 3), it should be understood that there may be a single heat spreading layer adjacent either the top 43a or the bottom 43b of the actuator housing 41.

The heat spreading layers 70a, 70b each have a second heat conductance greater than the first heat conductance to spread the waste heat from the upper and lower coils 44a, 44b to adjacent portions of the actuator housing 41. For example, the heat spreading layers 70a, 70b may include any one or more of copper and graphite (e.g., having a thermal conductivity of about 401 and upwards of 1600 W/m*K (i.e., about 4 times that of copper and about 8 times that of aluminum), respectively). Of course, the heat spreading layers 70a, 70b may include other and/or additional materials so that the heat spreading layer has a conductance less than the actuator housing 41.

For ease of explanation, further details of the heat spreading layers 70a, 70b will be explained with respect to a single heat spreading layer. However, the description with respect to the single heat spreading layer 70b is applicable to the other heat spreading layer 70a.

Damping elements 73b may be carried by the heat spreading layers 70b, for example, at the corners of the respective heat spreading layer (FIG. 4). The damping elements 73b may be used additionally with or as an alternative to the damping elements 62 carried by the flexures 60. As will be appreciated by those skilled in the art, the damping elements 73b may advantageously provide a mechanical stop for the field member 50 in any of the x-axis, the y-axis, and the z-axis direction.

Figure 6:
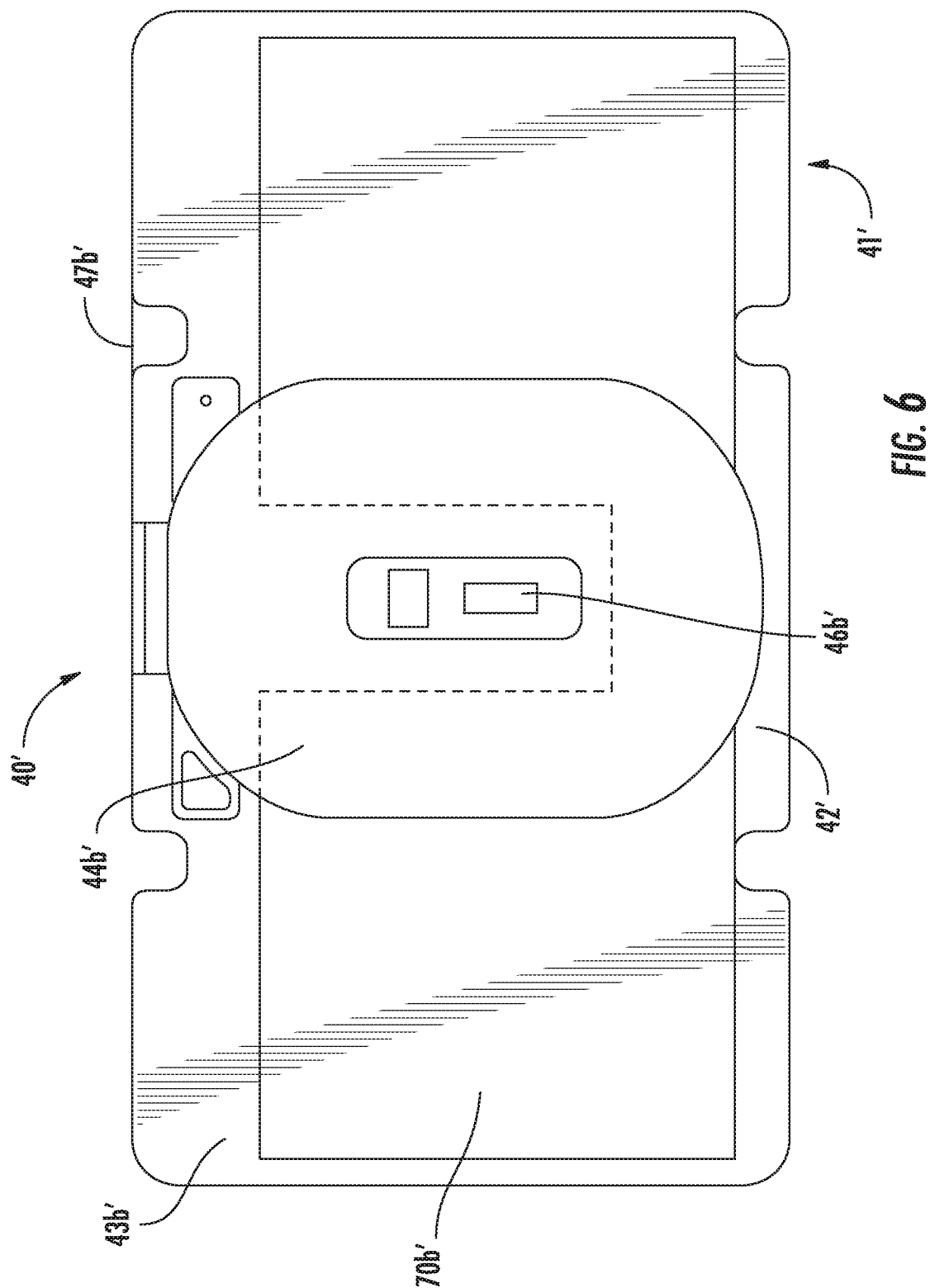
FIG. 6 is a schematic diagram of a portion of a haptic actuator in accordance with another embodiment.

Referring briefly to FIG. 6, in another embodiment, the heat spreading layer 70b' illustratively extends laterally outwardly from the medial portion 42' of the top 43b' of the actuator housing 41' to ends of the actuator housing (i.e., along a length of the actuator housing). The heat spreading layer adjacent the bottom of the actuator housing 41' may similarly extend laterally outwardly from the medial portion 42' to ends of the actuator housing. As will be appreciated by those skilled in the art, the heat spreading layer 70b' may be relatively thin so as to be able to extend under or over the coil 44b' and to increase or maximize heat transfer and heat spreading efficiency.

Figure 7:
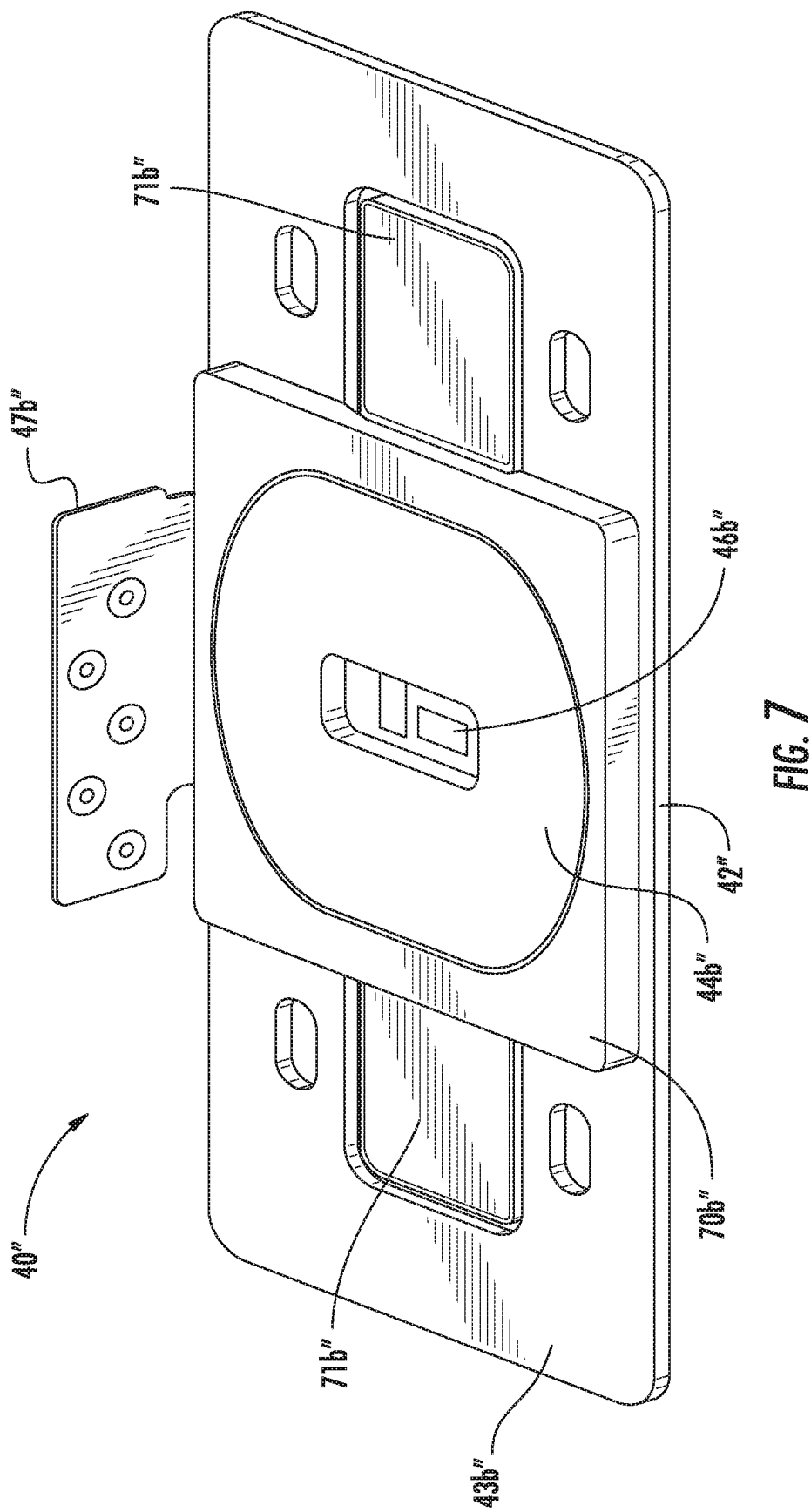
FIG. 7 is a schematic diagram of a portion of a haptic actuator in accordance with another embodiment.
Figure 8:
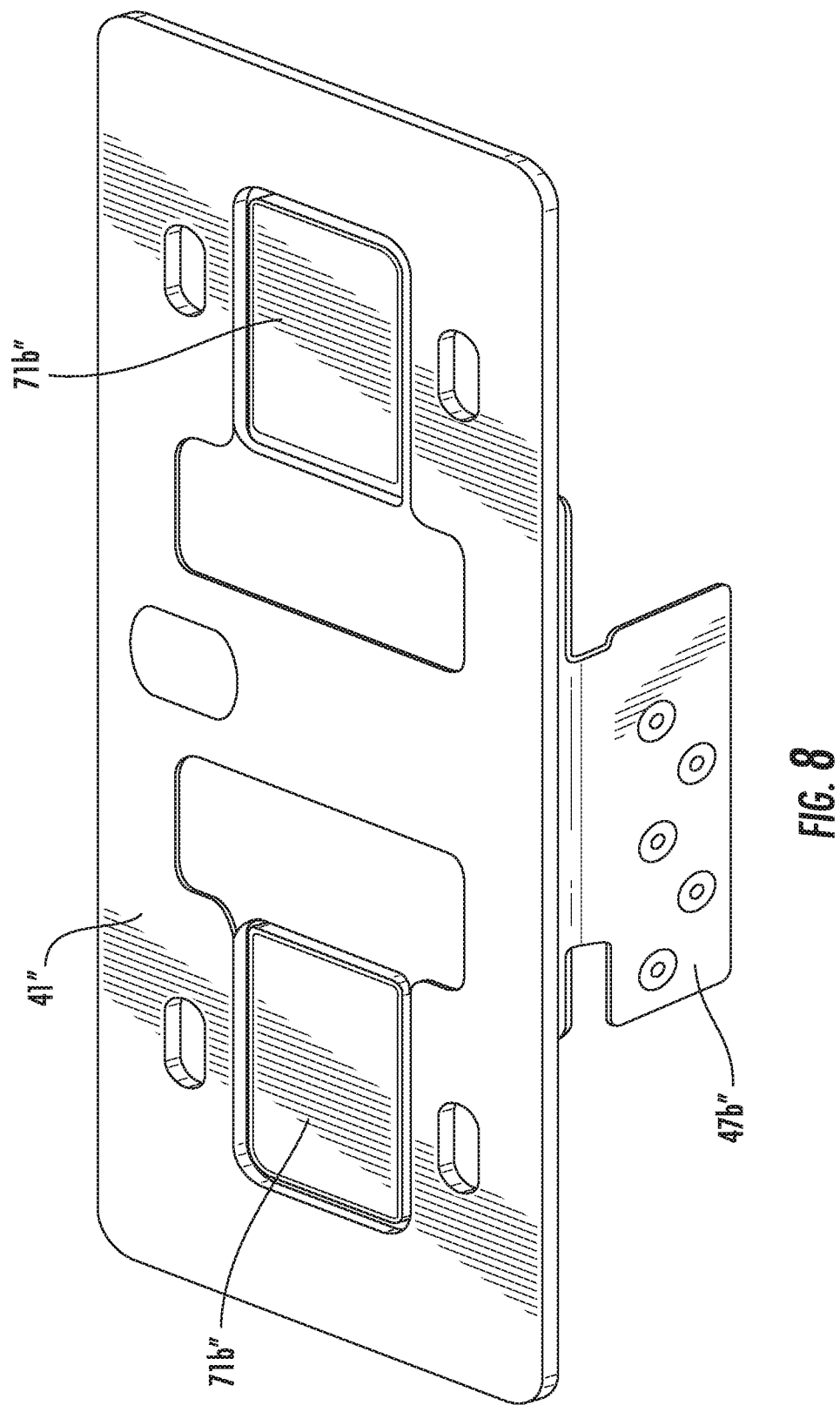
FIG. 8 is a schematic bottom perspective view of the haptic actuator of FIG. 7.

Referring now briefly to FIG. 7-8, in yet another embodiment, the heat spreading layer 70b" includes projections 71b" extending laterally outwardly from the medial portion 42" through the bottom 43b" of the actuator housing 41". The projections 71b" may conceptually be considered wings that extend from the medial portion 42". As will be appreciated by those skill in the art, the projections 71b" may increase waste heat removal efficiency by providing an increased surface area from which to extract the waste heat. Additionally, the heat spreading layer 70b" may be selectively exposed to the exterior of the actuator housing 41" (i.e., extending through the actuator housing) to provide a direct and relatively low resistance thermally conductive path for removal or spreading of the waste heat at specific locations about the haptic actuator 40". The heat spreading layer adjacent the top of the actuator housing may similarly include projections. Elements illustrated, but not specifically described with respect to the present embodiment, are similar to the elements described above and need not be further described.

Figure 9:
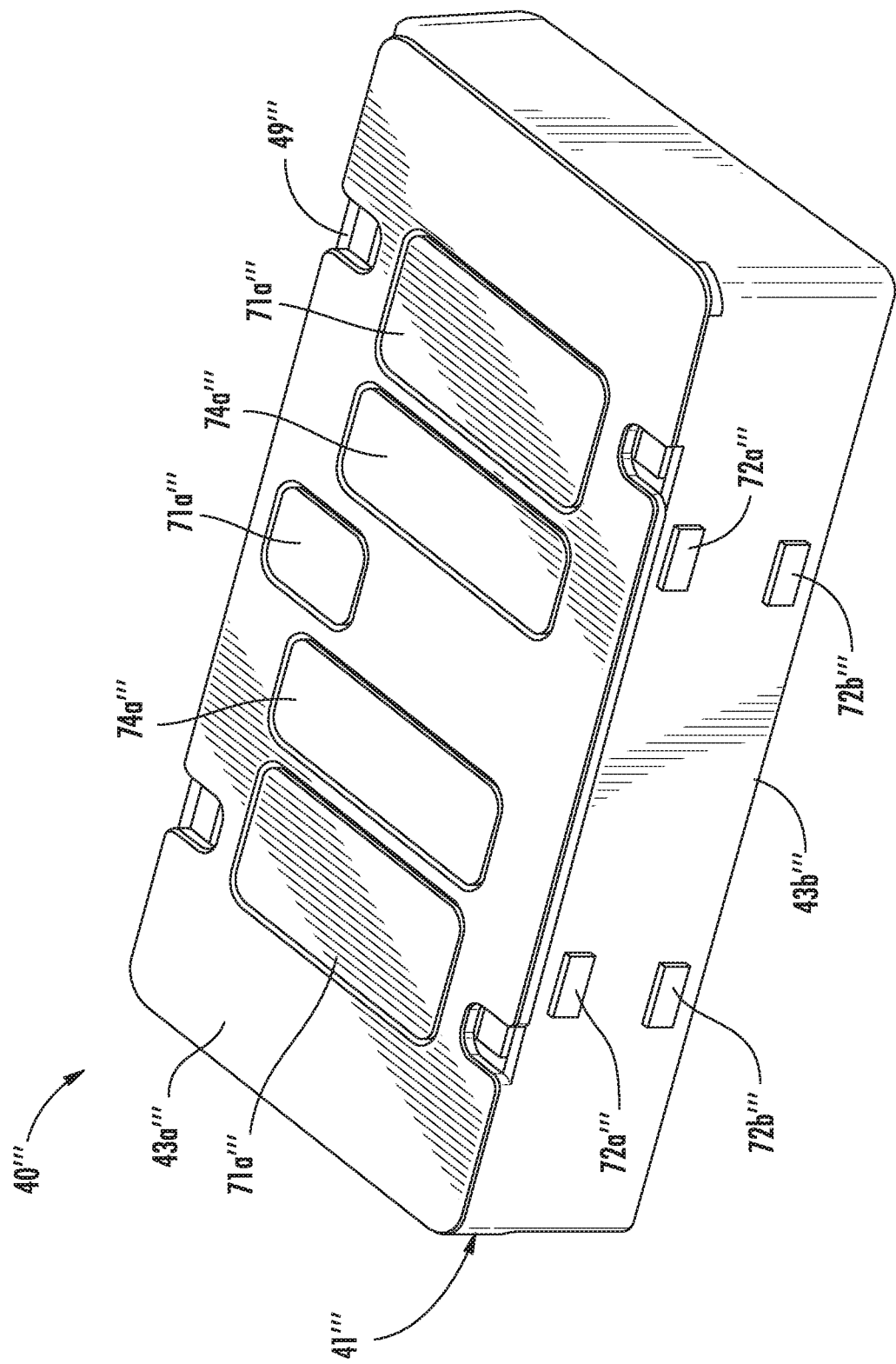
FIG. 9 is a schematic diagram of a haptic actuator in accordance with another embodiment.
Figure 10:
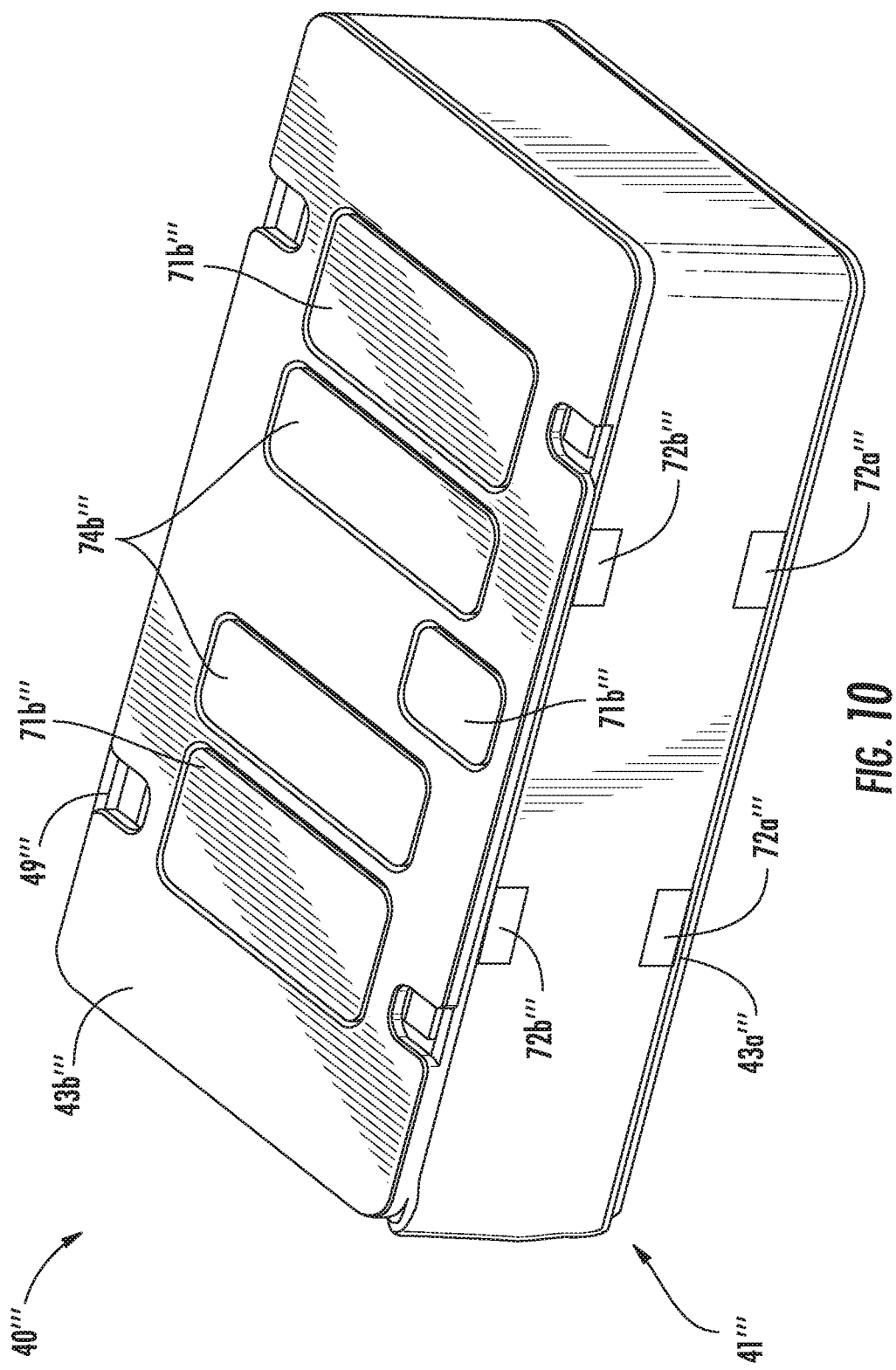
FIG. 10 is another schematic diagram of the haptic actuator of FIG. 9.
Figure 11:
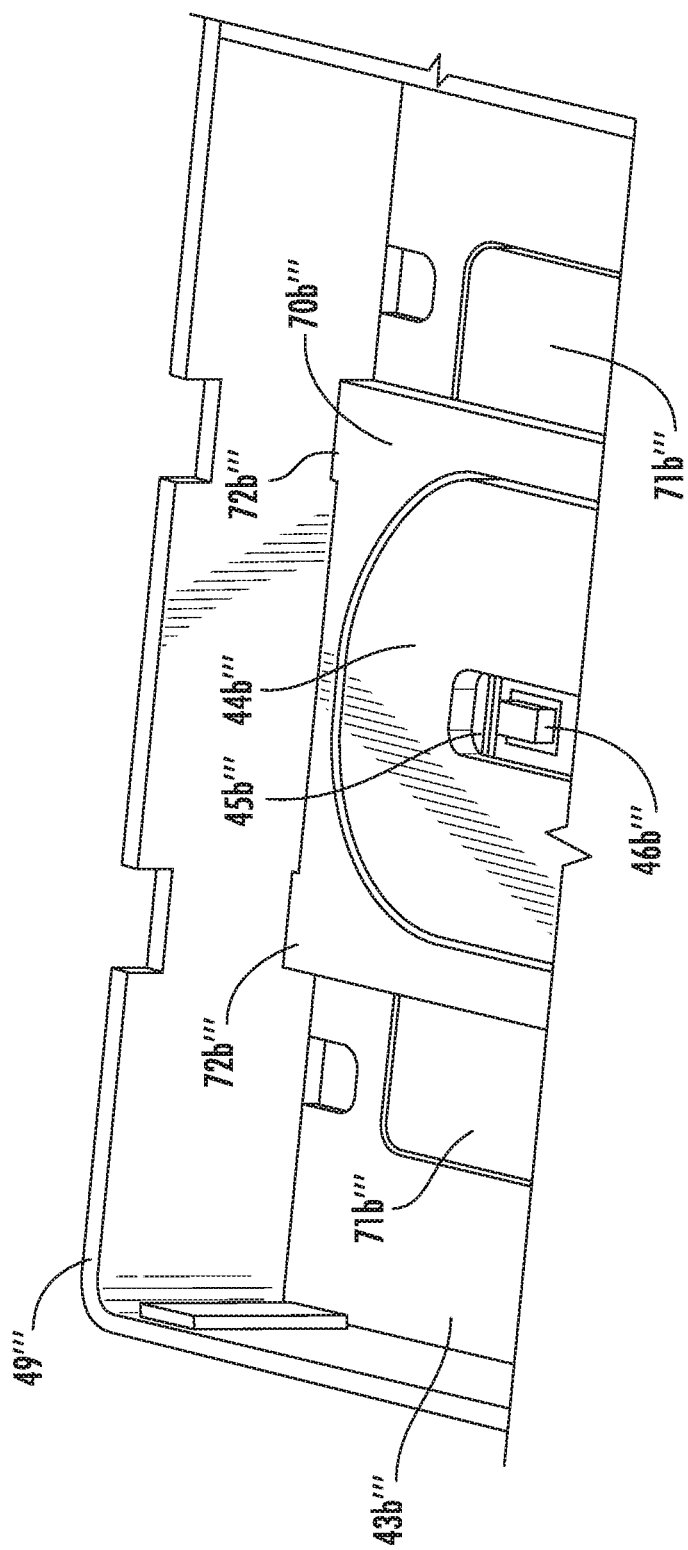
FIG. 11 is a schematic diagram of another portion of the haptic actuator of FIG. 9.
Figure 12:
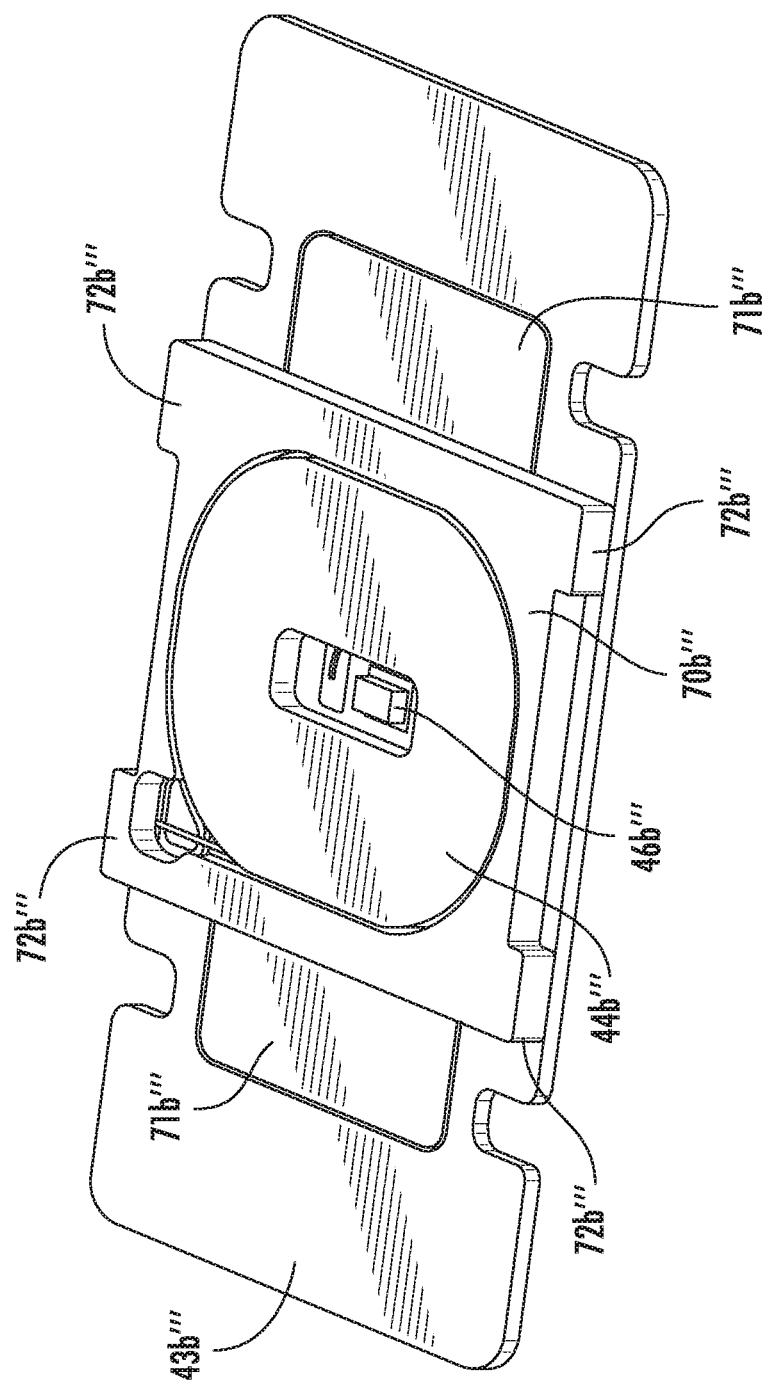
FIG. 12 is a schematic diagram of another portion of the haptic actuator of FIG. 9.
Figure 13:
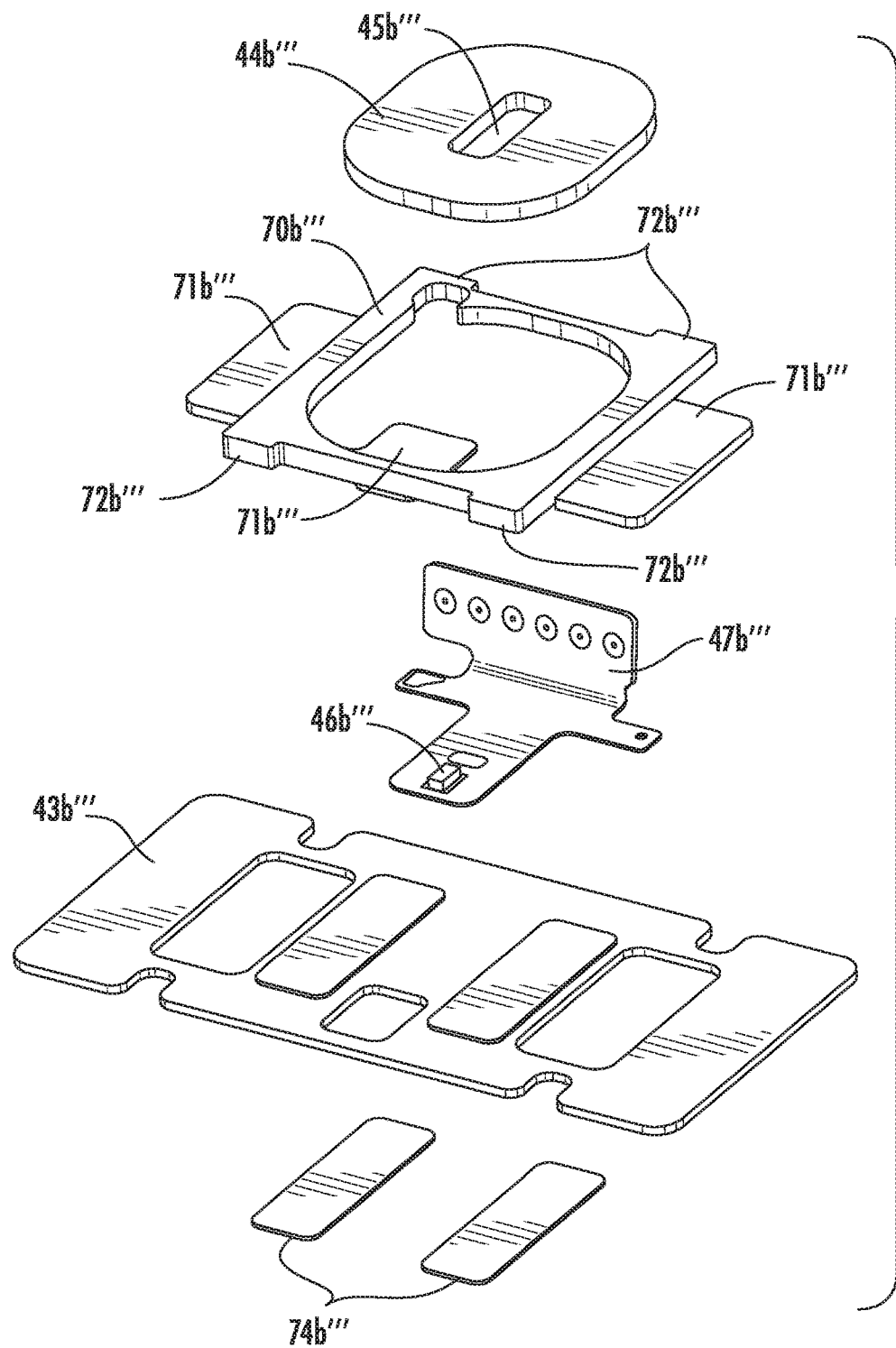
FIG. 13 is an exploded view of a portion of the haptic actuator of FIG. 9.

Referring now to FIGS. 9-13, in another embodiment, the heat spreading layer 70b''' associated with the single lower coil 44b''' includes projections 71b''' extending through the bottom 43b''' of the actuator housing 41'''. The heat spreading layer associated with the single upper coil 44a''' also includes projections 71a''' extending through the top 43a''' of the actuator housing 41''' (FIGS. 9-10). The heat spreading layer 70b''' also includes further projections 72b''' extending outwardly from corners of the heat spreading layer and through adjacent portions of the frame 49''' of the actuator housing 41'''. Further projections 72a''' extend outwardly from the corners of the heat spreading layer associated with the single upper coil 44a''' through adjacent portions of the frame 49''' (FIGS. 9-10). Thermal plates 74a''', 74b''' are be carried by the top and bottom 43a''', 43b''' of the actuator housing and in respective recesses for increased thermal control or removal of the waste heat.

The haptic actuator 40, including the heat spreading layers 70a, 70b may be particularly advantageous for removing or reducing the waste heat generated by the upper and lower coils 44a, 44b. Those skilled in the art will appreciate that certain applications include increased usage of haptic actuator 40 and thus, waste heat from the coils 44a, 44b also increases. Moreover, by including a single upper and lower coil 44a, 44b, as opposed to more coils, a larger electrical burden is placed upon the single coil rather than being shared among coils. Too much waste heat may impact the performance of the haptic actuator 40, for example, by limiting operations or disabling the haptic actuator. The heat spreading layers 70a, 70b move the waste heat away from the coils 44a, 44b, for example, through the actuator housing 41.

A method aspect is directed to a method of making a haptic actuator 40. The method includes mounting at least one coil 44a, 44b within a housing 41 in a medial portion 42 thereof with the at least one coil generating waste heat when electrically powered. The housing 41 includes a ferromagnetic material having a first heat conductance. The method includes mounting a field member 50 to be movable within the housing 41 responsive to the at least one coil 44a, 44b. The field member 50 includes at least one permanent magnet 51 establishing a magnetic path with the housing 41. The method also includes thermally coupling a heat spreading layer 70a, 70b to the housing 41 adjacent the at least one coil 44a, 44b. The heat spreading layer 70a, 70b has a second heat conductance greater than the first heat conductance to spread the waste heat from the at least one coil 44a, 44b to adjacent portions of the housing 41.

While several embodiments have been described herein, it should be appreciated that any element from any one or more embodiments may be used with any other element or elements from any other embodiment. Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A haptic actuator comprising:
   a housing comprising a ferromagnetic material having a first heat conductance;
   at least one coil carried by the housing;
   a field member movable within the housing responsive to the at least one coil, the field member comprising at least one permanent magnet; and
   a heat spreading layer thermally coupled to the housing adjacent the at least one coil, the heat spreading layer comprising at least one projection extending through the housing and having a second heat conductance greater than the first heat conductance.

2. The haptic actuator of claim 1, wherein the heat spreading layer is between the at least one coil and adjacent portions of the housing; and wherein the heat spreading layer comprises a non-ferromagnetic material.

3. The haptic actuator of claim 1, wherein the heat spreading layer extends laterally outwardly from the medial portion of the housing.

4. The haptic actuator of claim 1, wherein the at least one coil comprises a single upper coil and a single lower coil.

5. The haptic actuator of claim 4, wherein at least one of the single upper coil and the single lower coil has an opening in a central portion thereof; and comprising a temperature sensor within the opening in the central portion.

6. The haptic actuator of claim 1, comprising at least one flexure movably mounting the field member within the housing.

7. The haptic actuator of claim 1, wherein the housing comprises steel.

8. The haptic actuator of claim 1, wherein the heat spreading layer comprises at least one of copper and graphite.

9. An electronic device comprising:
a housing;
wireless communications circuitry carried by the housing;
a haptic actuator carried by the housing and comprising
an actuator housing comprising a ferromagnetic material having a first heat conductance,
at least one coil carried by the actuator housing,
a field member movable within the actuator housing responsive to the at least one coil, the field member comprising at least one permanent magnet establishing a magnetic path with the actuator housing, and
a heat spreading layer thermally coupled to the actuator housing adjacent the at least one coil, the heat spreading layer comprising at least one projection extending through the housing and having a second heat conductance greater than the first heat conductance; and
a controller carried by the housing and configured to cooperate with the wireless communications circuitry to perform at least one wireless communications function and selectively operate the haptic actuator.

10. The electronic device of claim 9, wherein the heat spreading layer is between the at least one coil and adjacent portions of the actuator housing; and wherein the heat spreading layer comprises a non-ferromagnetic material.

11. The electronic device of claim 9, wherein the heat spreading layer extends laterally outwardly from the medial portion of the actuator housing.

12. The electronic device of claim 9, wherein the at least one coil comprises a single upper coil and a single lower coil.

13. The electronic device of claim 9, comprising at least one flexure movably mounting the field member within the actuator housing.

14. A method of making a haptic actuator comprising:
mounting at least one coil within a housing, the housing comprising a ferromagnetic material having a first heat conductance;
mounting a field member to be movable within the housing responsive to the at least one coil, the field member comprising at least one permanent magnet; and
thermally coupling a heat spreading layer to the housing adjacent the at least one coil, the heat spreading layer comprising at least one projection extending through the housing and having a second heat conductance greater than the first heat conductance.

15. The method of claim 14, wherein thermally coupling the heat spreading layer comprises thermally coupling the heat spreading layer between the at least one coil and adjacent portions of the housing; and wherein the heat spreading layer comprises a non-ferromagnetic material.

16. The method of claim 14, wherein thermally coupling the heat spreading layer comprises thermally coupling the heat spreading layer to extend laterally outwardly from the medial portion of the housing.

17. The method of claim 14, wherein the at least one coil comprises a single upper coil and a single lower coil.

18. The method of claim 14, wherein mounting the field member comprises mounting the field member within the housing using at least one flexure.

19. A haptic actuator comprising:
a housing comprising a ferromagnetic material having a first heat conductance;
at least one coil carried by the housing in a medial portion thereof and generating waste heat when electrically powered;
a field member movable within the housing responsive to the at least one coil, the field member comprising at least one permanent magnet establishing a magnetic path with the housing; and
a heat spreading layer thermally coupled to the housing adjacent the at least one coil, the heat spreading layer comprising at least one projection extending through the housing and having a second heat conductance greater than the first heat conductance to spread the waste heat from the at least one coil to adjacent portions of the housing.

20. The haptic actuator of claim 19, wherein the heat spreading layer is between the at least one coil and adjacent portions of the housing; and wherein the heat spreading layer comprises a non-ferromagnetic material.

21. The haptic actuator of claim 19, wherein the heat spreading layer extends laterally outwardly from the medial portion of the housing.

22. The haptic actuator of claim 19, wherein the at least one coil comprises a single upper coil and a single lower coil.

23. The haptic actuator of claim 22, wherein at least one of the single upper coil and the single lower coil has an opening in a central portion thereof; and comprising a temperature sensor within the opening in the central portion.

24. The haptic actuator of claim 19, comprising at least one flexure movably mounting the field member within the housing.

25. The haptic actuator of claim 19, wherein the housing comprises steel.

26. The haptic actuator of claim 19, wherein the heat spreading layer comprises at least one of copper and graphite.

* * * * *